United States Patent [19]

Nowak et al.

[11] Patent Number: 5,077,091

[45] Date of Patent: Dec. 31, 1991

[54] DEPOSITION PROCESS IN THE VAPOUR PHASE AT LOW TEMPERATURE OF A CERAMIC COATING OF THE METALLIC NITRIDE OR CARBONITRIDE TYPE

[75] Inventors: Jean-Francois Nowak, Saint Etienne; Frederic Schuster, Toulouse; Francis Maury, Labege; Roland Morancho, Toulouse, all of France

[73] Assignees: Nitruvid, Argenteuil; C3F (Compagnie Francaise de Forges et Fonderies), Puteaux, France

[21] Appl. No.: 479,708

[22] Filed: Feb. 14, 1990

[30] Foreign Application Priority Data

Feb. 16, 1989 [FR] France ............... 89 02045

[51] Int. Cl.$^5$ ............... C23C 16/34; C23C 16/36
[52] U.S. Cl. ............... 427/255.2; 427/249; 427/255.1
[58] Field of Search ............... 427/249, 255.1, 255.2

[56] References Cited

U.S. PATENT DOCUMENTS

| | | | |
|---|---|---|---|
| 4,321,073 | 3/1982 | Blair | 427/252 |
| 4,393,097 | 7/1983 | Hirai et al. | 427/255.2 |
| 4,605,566 | 8/1986 | Matsui et al. | 427/255.2 |

FOREIGN PATENT DOCUMENTS 0095963 12/1983 European Pat. Off.

OTHER PUBLICATIONS

Chemical Abstracts, vol. 74, No. 16, Apr. 19, p. 161, Abstract No. 78827x, Columbus, Ohio, U.S.A.; B. G. Gribov et al.
"Metallic Films Obtained by the Pyrolysis of Pi-Complexes of Chromium and Molybdenum in the Gas Phase" and Dokl. Akad. Nauk SSSR 1970, vol. 194, No. 3, pp. 580–582.

Primary Examiner—Stanley Silverman
Assistant Examiner—Margaret Bueker
Attorney, Agent, or Firm—Cushman, Darby & Cushman

[57] ABSTRACT

The object of the invention is a one-step deposition process of a coating of the ceramic type based on nitrides or carbonitrides of at least one metallic element selected from Cr, V, Zr, W, Mo, Co, Mn, Ni, Hf and Ta on a metallic or ceramic substrate, massive or obtained from fibres, by deposition in the vapor phase wherein a coating is deposited on the substrate by a chemical means at a pressure lower than 10 kPa at a temperature lower than 600° C. and by using a system of precursors constituted simultaneously of:

an organo-metallic precursor of the said metallic element selected from the organo-metallic compounds of the sandwich type of general formula:

$$[Ar^1 M\ Ar^2_n]L_x\ L'_y$$

a nitrogen precursor selected from ammonia and hydrazine.

6 Claims, 2 Drawing Sheets

DEPOSITION PROCESS IN THE VAPOUR PHASE AT LOW TEMPERATURE OF A CERAMIC COATING OF THE METALLIC NITRIDE OR CARBONITRIDE TYPE

The present invention relates to a deposition process of a coating of the ceramic type based on nitrides or carbonitrides of chromium or other metallic elements such as Cr, V, Zr, W, Mo, Co, Mn, Ni, Hf and Ta in which the coating of the ceramic type is deposited at low temperature and in a single step.

The production of coatings of the type based on nitrides or carbonitrides of metallic elements by the technique of chemical deposition in the vapour phase by case hardening is well known from the patent FR. 2,527,226.

The production of a metallic vapour is obtained by the action of a halide on a cemented powder constituted by the element to be deposited, for example chromium or ferro-chromium in the case of a chromization, at relatively high temperatures included between 900° and 1100° C. depending on the nature of the coating to be carried out, in the presence of a reducing or neutral atmosphere and ammonia.

Moreover, processes for the low temperature deposition of chromium are known. In the publication of B. B. OWEN and R. T. WEBBER, Trans. AIME 175 (1948) 693 a deposition process based on chromium in the gas phase starting from the compound (hexacarbonyl) chromium at temperatures included between 250° and 650° C. has been described. However, the adhesiveness of these coatings is variable and the analysis of their composition reveals high contents of oxygen derived from the decomposition of the carbonyl groups.

The publication of B. D. NASH, T. T. CAMPBELL and F. E. BLOCK, U.S. Bureau of Mines, Report Investigation 7112, Washington 1968, describes a chromium-based process for coating in the gas phase starting from a metal precursor free of oxygen, dibenzene chromium, at temperatures from 300° to 500° C. The deposits obtained contain variable amounts of carbon.

The aim of the present invention is the production at low temperature of monophase layers of nitrides or carbonitrides of chromium or other metallic elements on substrates of various kinds by the technique of chemical deposition in the vapour phase so as to avoid the disadvantages of the treatments at high temperature.

For this purpose, a process has been developed which utilizes simultaneously an organic-metallic source which gives rise to deposits of carbon and metal at low temperature and a nitrogen source to give coatings of the ceramic type at low temperature on substrates of various kinds.

Thus, the object of the present invention is a one-step deposition process of a coating of the ceramic type based on nitrides or carbonitrides of at least one metallic element selected from Cr, V, Zr, W, Mo, Co, Mn, Ni, Hf and Ta on a metallic or ceramic substrate, massive or obtained from fibres, by deposition in the vapour phase wherein a coating is deposited on the substrate by the chemical route at a pressure lower than 10 kPa at a temperature lower than 600° C. and by using a system of precursors constituted simultaneously of:
an organo-metallic precursor of the said metallic element selected from the organo-metallic compounds of the sandwich type of general formula:

$[Ar^1 MAr^2{}_n]L_x L'_y$ in which $Ar^1$ and $Ar^2$, identical or different, represent a $C_5$–$C_8$ aromatic ring optionally substituted by 1 to 6 $C_1$–$C_4$ alkyl groups or a phenyl group, n represents 0 or 1, M represents a metallic element such as defined above, L and L' each represents a hydrogen atom or a halogen atom, a CO, $CF_3$, R, RCN, $PR_3$, SR and SeR group, R being a $C_1$–$C_4$ alkyl group or a phenyl group optionally substituted by 1 or 2 $C_1$–$C_4$ alkyl groups, pyridine, tetrahydrofuran, acetylacetonate, tetracyanoquinodimethane or L and L' represent together with M a ring $MS_4$ or $MS_5$ and x+y represent 0 or 4.
a nitrogen precursor selected from ammonia and hydrazine.

A first group of compounds of the sandwich type used are those in which the metallic element (M) is linked by means of bonds of the $\pi$ co-ordinate type to one or two aromatic rings. In the case in which M is linked to two rings, M is situated between the planes formed by the two rings.

In this group of compounds the metal is in the zero valent state.

As examples of such compounds, mention may be made of the complexes of:

| | |
|---|---|
| chromium: | $Cr(C_5H_5)_2$, $Cr(C_6H_6)_2$, |
| vanadium: | $V(C_5H_5)_2$, $V(C_6H_6)_2$, $V(C_5H_5)(C_7H_7)$, |
| tungsten: | $W(C_6H_6)_2$, |
| molybdenum: | $Mo(C_6H_6)_2$, |
| cobalt: | $Co(C_5H_5)_2$, |
| manganese: | $Mn[C_5H_4(CH_3)_2]$, $[Mn(C_5H_5)_2]_n$ (which is a polymeric compound), |
| nickel: | $Ni(C_5H_5)_2$, $Ni[C_8H_7(C_6H_5)]_2$, (aromatic ring with 8 carbon atoms substituted by a phenyl group). |

A second group is constituted by the compounds in which the metallic element (M) is linked, on the one hand, to one or two aromatic rings ($Ar^1$ and $Ar^2$) by means of co-ordinate $\pi$ bonds and, on the other, to ligands L and L' by means of bonds which may be covalent or co-ordinate. The number of ligands L and L' is a function of the nature of the ligand and of the nature of the metal.

As examples of compounds in which the ligands L and L' are linked by means of covalent bonds are found for:

| | |
|---|---|
| vanadium: | $V(C_5H_5)_2Cl$, $V(C_5H_5)_2$, $(C_6H_5S)_2$, $V[C_5H_4(CH_3)]_2Cl_2$, |
| zirconium: | $Zr(C_5H_5)_2Cl_2$, $Zr(C_8H_8)Cl_2$, |
| hafnium: | $Hf(C_5H_5)_2(CH_3)_2$, |
| tantalum: | $Ta(C_5H_5)_2H_3$, |
| tungsten: | $W(C_5H_5)_2S_4$ (in which the metallic element forms a 5-membered ring with the 4 sulphur atoms), |
| molybdenum: | $Mo(C_5H_5)Cl_2$. |

Examples of compounds in which one or both of the ligands L and L' are linked by means of co-ordinate bonds are:

| | |
|---|---|
| for vanadium: | $V(C_5H_5)(CO)_4$, $V(C_6H_6)(CH_3CN)_3$, $V(C_7H_7)CO$, |
| zirconium: | $Zr(C_5H_5)_2(CO)_2$, $Zr(C_5H_5)(C_5H_7O_2)_2Cl$ ($C_5H_7O_2$ = acetylacetate), $Zr(C_8H_8)_2$ THF |

-continued

| | (THF = tetrahydrofuran) |
|---|---|
| hafnium: | Hf(C$_5$H$_5$)$_2$ (CO)$_2$. |
| tungsten: | W(C$_5$H$_5$) (C$_6$H$_5$) (CO)$_3$, W(C$_7$H$_7$) (C$_6$H$_5$Se) (CO)$_2$ |
| molybdenum: | Mo(C$_5$H$_5$)$_2$(CO)$_3$. |
| cobalt: | Co[C$_5$(CH$_3$)$_5$] (CO)$_2$. |
| manganese: | Mn(C$_6$H$_6$) (CH$_3$CN)$_3$. |
| nickel: | Ni(C$_5$H$_5$) (CF$_3$)P(C$_6$H$_5$)$_3$. |

However, the organo-metallic precursor is advantageously selected from the compounds of the sandwich type in which the central metallic element is linked to two identical C$_5$-C$_8$ aromatic rings optionally substituted by 1 to 6 C$_1$-C$_4$ alkyl groups.

The deposition is preferably carried out at a temperature between 300° and 600° C.

The invention makes it possible, in particular, to carry out coatings based on nitrides or carbonitrides of chromium by using as precursor dibenzene chromium, the bis(arene) chromium substituted by one or several alkyl groups having from 1 to 4 carbon atoms or bis (cyclopentadienyl) chromium. The preferred organo-metallic precursor for the coatings is dibenzene chromium.

As nitrogen precursor, hydrazine is preferred because its lower thermal stability than that of ammonia is better suited to the temperatures of decomposition of the organo-metallic precursor.

In a variant of the invention, a reducing gas such as hydrogen or an additional source of carbon selected from hydrocarbons, preferably methane or ethylene, is introduced into the gas phase. The introduction of an additional source of carbon makes it possible to enrich the carbonitride coatings in carbon.

Furthermore, it is possible to obtain coatings more or less rich in nitrogen going from the carbonitrides to the nitrides by adjusting the ratio of the partial pressures of the organo-metallic precursor and the nitrogen precursor.

The process of the present invention consisting of a thermal decomposition of the chemical systems described in a reactor for chemical deposition in a single step in a single installation functioning in the gas phase at low pressure is an undeniable advantage making possible, on the one hand, the production of deposits of uniform thickness in reactors of large capacity and/or on substrates of complex form and, on the other hand, substantial economies in chemical reagents and fluids.

Furthermore, according to the invention it is possible to carry out a preliminary treatment of the surfaces of the components to be coated, for example a pickling with the aid of a plasma at low pressure.

The coatings with metallic nitrides or carbonitrides are adhesive in spite of a well-defined and non-diffuse interface. The low temperature of the substrate during the deposition makes possible the preservation of the mechanical properties and the dimensional characteristics of the latter.

The coatings are produced on substrates of various kinds: metallic substrates such as steels, superalloys based on nickel or cobalt, aluminum alloys, titanium alloys, zirconium alloys or ceramic substrates such as aluminum or silica since these alloys do not participate chemically in the reaction generating the growth of the film in contrast to the chromization at high temperature, or composites with a metallic or ceramic matrix, carbon fibres, ceramic fabrics of the type C—C, C—Si, SiC—SiC.

The process according to the invention as well as an installation for its implementation in the case of a coating based on chromium nitrides or carbonitrides will be described below by making reference to the appended drawings in which.

Figure 1:
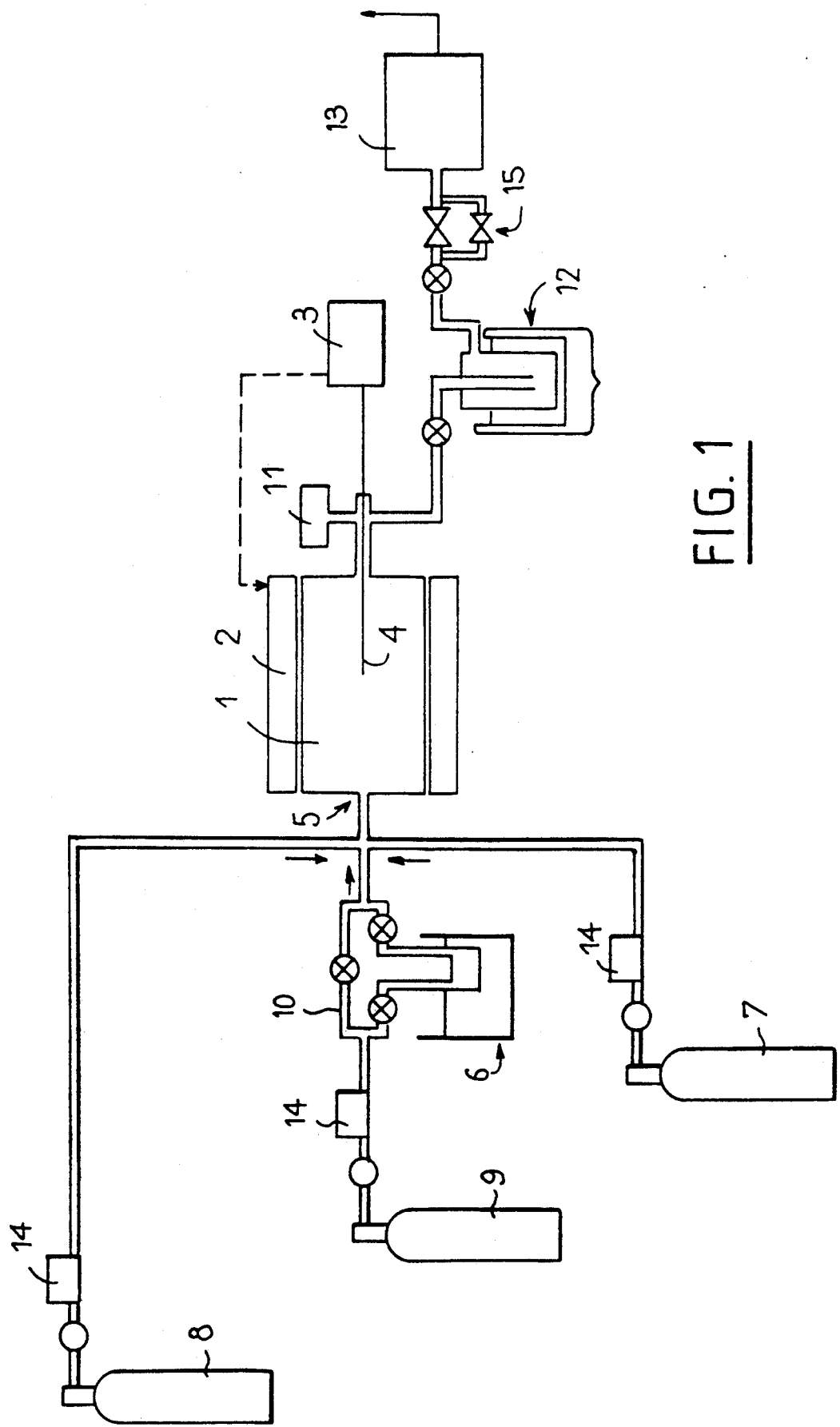
FIG. 1 represents a scheme of the entire installation used for carrying out the process according to the invention.

After conventional cleaning, the substrates are introduced into the horizontal tubular reactor for chemical deposition in the vapour phase (C.V.D.) 1. The reactor is connected to thermostatted heating resistances 2, controlled by a temperature regulator 3 receiving temperature data from the probe 4 inserted into the interior of one of the samples.

The entrance 5 of the reactor is connected by stainless steel ducts, on the one hand, to either a pyrex saturator 6 containing the chromium organo-metallic precursor in the case of a solid compound such as Cr(C$_6$H$_6$)$_2$, or a bubbler in the case of a liquid compound, and, on the other, to the nitrogen source constituted of a cylinder of ammonia or a thermostatted bubbler of N$_2$H$_4$ and, finally, to a third line connected to a cylinder of gas 8 making possible either dilution by an inert gas in order to adjust both the composition of the initial gas phase and the hydrodynamics or the addition of a reducing gas such as H$_2$ or a carbon source such as CH$_4$.

A flow of an inert gas (He or Ar) derived from the cylinder 9 is fed into the saturator 6. Valves make it possible to sweep the substrate by the inert gas with the aid of the branch circuit 10 or, conversely, to pass the inert gas into the precursor source of chromium, dibenzene chromium for example.

In a preliminary phase, the ducts are purged by alternating sequences of placing under vacuum-filling with inert gas, followed by dynamic pumping for several hours which ensures a vacuum of 0.13 Pa in the reactor.

The inert gas issuing from the cylinder 9 is then delivered by the branch circuit 10 in order to fill the reactor and the ducts at a flow rate corresponding to the desired flow rate for the experiment. The outlet of the reactor 1 is connected to a pressure gauge 11 and a liquid nitrogen trap 12 intended to condense the volatile products derived from pyrolysis and to protect the pumping system 13 utilized to maintain a low pressure in the reactor. The flow rate is fixed and regulated by the mass flow meter 14. The pressure is then lowered to the vicinity of the working pressure by means of the valve 15. The reactor is then heated by the electrical resistance furnace 2 to the desired temperature.

After stabilization of all of the parameters for about 15 minutes, ammonia (or hydrazine) is introduced into the reactor followed by the vapours of the organo-metallic derivative of the metallic element by opening the saturator 6 and closing the branch circuit 10, and the pressure in the reactor is adjusted to the prescribed value by means of the valve 15.

The deposition experiment begins and takes place without any further intervention.

When it is finished, the saturator 6 is disconnected from the circuit, the inert gas is again circulated through the branch circuit 10 and the supply of $NH_3$ (or hydrazine) is cut off. The heating is maintained for a period varying between 5 and 30 mn. The cooling phase begins at a relatively slow mean rate varying between 1° and 10° C./mn. When the reactor is at room temperature, the coated substrate may be retrieved.

Typical operating conditions for the implementation of the process are the following:
- total pressure: $10^{-2}$ to 10 kPa
- substrate temperature: 300° to 600° C.
- partial pressure of $NH_3$ ($pNH_3$): 0 to 200 Pa
- partial pressure of Cr $(C_6H_6)_2$: 0.5 to 20 Pa
- $pNH_3/pCr$ $(C_6H_6)_2$: 0 to 100
- total gas flow rate: 0.25 to 0.50 $Pa.m^3s^{-1}$ (reactor diameter: 15 mm).

In order to clearly illustrate the object of the invention two non-restrictive examples will be described below of the production of layers of $Cr_2(C,N)$ and CrN on austenitic stainless steel substrates.

The following analyses are carried out on the coated substrates: analysis by electronic spectroscopy for the chemical analysis (E.S.C.A.) which reveals the presence of the elements Cr, C, N with, in particular, the bond energies for carbon and nitrogen, characteristic of metallic carbides and nitrides; analysis by electron microprobe giving the overall composition of the deposit, analysis by luminescent discharge spectroscopy of the profile of the concentration of the elements, measurement of the Vickers microhardness, measurement of the electrochemical behaviour by determination of the intensity-potential curves in 1M $H_2SO_4$ medium and test of adhesiveness with adhesive tape.

The adhesion test consists of marking out a square on the layer, then of sticking a piece of adhesive tape to it and tearing off the adhesive tape.

The thickness of the coating and hence the rate of growth of the latter are measured by the scanning electron microscope, this latter also provides information concerning the morphology of the coating. Finally, the analysis by X-ray diffraction shows the amorphous or crystalline structure of the coating.

EXAMPLE 1

A flat stainless steel substrate 1 mm thick is first polished, rinsed with ultrasonic in alcohol, then dried with dry compressed air in order to obtain a clean and thoroughly degreased surface. The experimental conditions for the deposition of the coating are the following:
- Temperature of the substrate: 420° C.
- $NH_3$ flow rate: 0.08 $Pa.m^3s^{-1}$
- Pressure: 300 Pa
- Vapour pressure of the Cr precursor: 9.3 Pa
- Helium flow rate through the precursor: 0.25 Pa $m^3s^{-1}$
- Deposition time: 1 h 30.

The analyses and tests gave the following results: the coating is a chromium carbonitride of composition Cr $C_{0.26}$ $N_{0.36}$ which may be written $Cr_2$ (C,N), of amorphous structure and smooth and metallic appearance. The test with the adhesive tape causes no loosening of material, which demonstrates good adhesion. The concentration profile by luminescent discharge spectroscopy shows a homogeneous distribution in depth of the element Cr, V, N in the coating. The superficial microhardness of the substrate of 2450 $N/mm^2$ becomes, after deposition, equal to 24500 $N/mm^2$ under a load of 50 grams.

Figure 2:
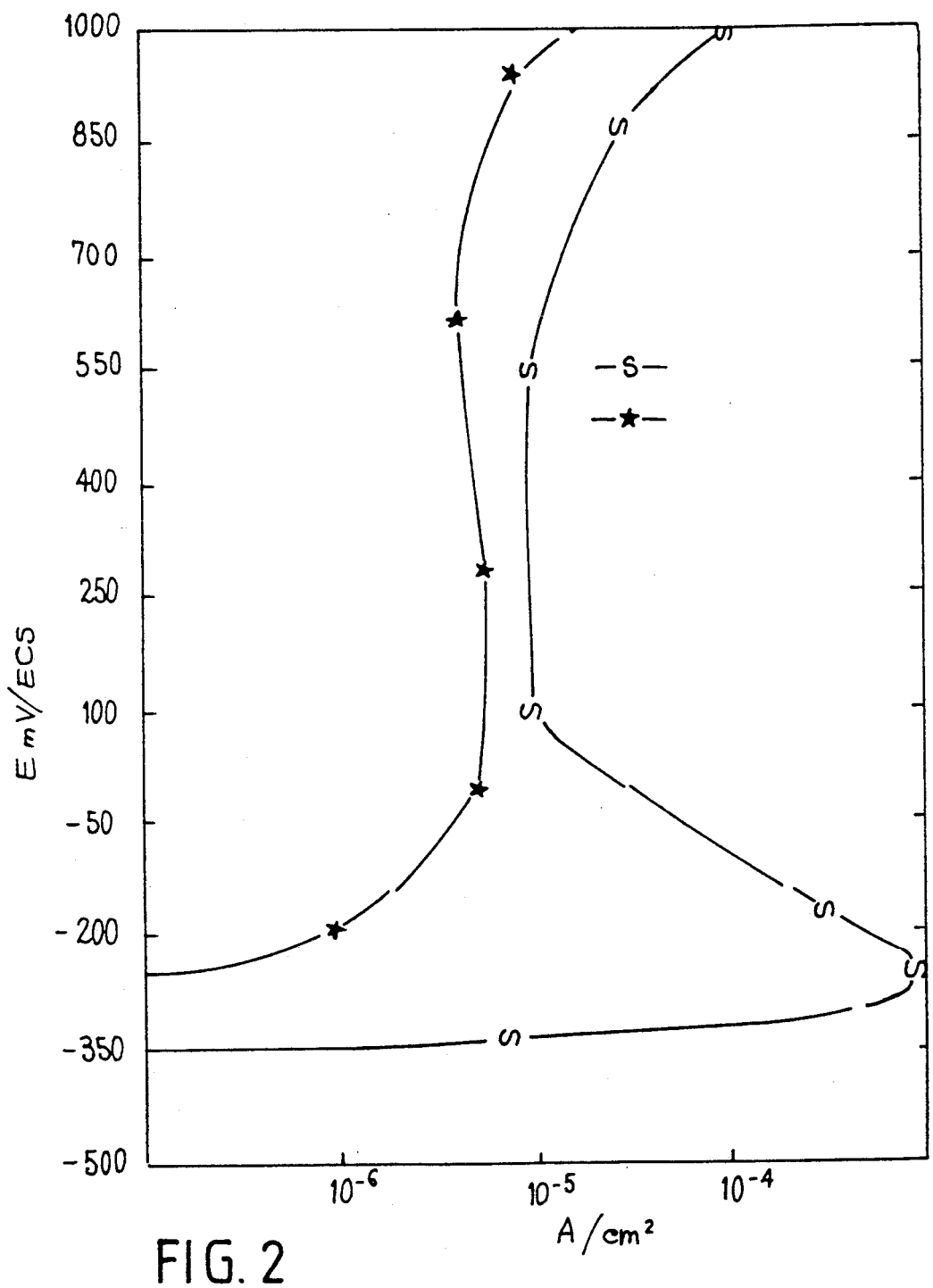
FIG. 2 represents a diagram of the intensity-potential curves in H$_2$SO$_4$ medium of a steel coated by the process according to the invention and of a non-coated steel.

FIG. 2 provides the intensity-potential curve in 1M $H_2SO_4$ medium of non-coated steel and that for coated steel. The current densities are shown along the abscissa in $A/cm^2$ and the potentials in millivolts along the ordinate with reference to a saturated calomel electrode. It is observed that the coating leads to an enhancement of the corrosion potential, with the appearance of a plateau of passivity. Moreover, there is no longer an activity peak as for the non-coated steel. Repeated experiments demonstrate the complete reproducibility of these results.

The rate of growth of the film is 10 μm/h, the thickness of the coating is 15 μm during 1 h 30 of the deposition experiment.

EXAMPLE 2

A flat austenitic stainless steel substrate of 1 mm is prepared under the same conditions as in Example 1. The experimental conditions for the deposition of the coating are the following:
- Substrate temperature: 530° C.
- $NH_3$ flow rate: 0.085 $Pa.m^3s^{-1}$
- Pressure: 300 Pa
- Vapour pressure of the Cr precursor: 9.3 Pa
- Helium flow rate through the Cr precursor: 0.25 $Pa.m^3s^{-1}$
- Deposition time: 1 h 30

The analysis by X-ray diffraction clearly shows the crystalline phase CrN. The analysis by microprobe gives the overall chemical composition Cr $N_{1.1}$, $C_{0.05}$ and the E.S.C.A. shows the presence of free carbon. The coating is thus of the CrN + free C type. The adhesion test with the adhesive tape is satisfactory and the microhardness is 19600 $N/mm^2$ under an applied load of 100 grams. The thickness is 38 μm, i.e. a growth rate of 25 μm/h.

The examples 1 and 2 are presented in Table 1 below as well as other examples carried out in accordance with the process of the invention.

TABLE 1

| Ex. | T° | Pres. (Pa) | $PNH_3/PCr$ $(C_6H_6)_2$ | $CrN_xC_y$ | type | structure |
|---|---|---|---|---|---|---|
| 1 | 420 | 300 | 10 | $CrN_{0.36}C_{0.26}$ | $Cr_2(C,N)$ | amorphous |
| 2 | 530 | 300 | 40 | $CrN_{1.1}C_{0.05}$ | CrN-free C | crystalline |
| 3 | 400 | 300 | 10 | $CrN_{0.13}C_{0.30}$ | $Cr_2(C,N)$ | amorphous |
| 4 | 450 | 300 | 10 | $CrN_{0.5}C_{0.17}$ | $Cr_2(C,N)$ | amorphous |
| 5 | 510 | 300 | 10 | $CrN_{0.97}C_{0.14}$ | Cr(C,N) | crystalline |
| 6 | 560 | 300 | 10 | $CrN_{1.2}C_{0.07}$ | CrN-free C | crystalline |
| 7 | 510 | 300 | 0 | $CrN_0C_{0.39}$ | $Cr_7C_3$ | crystalline |
| 8 | 510 | 300 | 60 | $CrN_{1.03}C_{0.08}$ | CrN-free C | crystalline |

The high content of chromium (between 75 and 90% by weight), the high degree of hardness (between 18000 and 30000 units at a load of 50 g) and the hexagonal structure with the plane of maximal density oriented parallel to the surface of the substrate for $Cr_2N$ and crystalline $Cr_2(C,N)$ provide evidence of good resistance to corrosion, friction and wear and tear.

We claim:

1. One-step deposition process of a coating of the ceramic type based on nitrides or carbonitrides of at least one metallic element selected from Cr, V, Zr, W, Mo, Co, Mn, Ni, Hf and Ta on a metallic or ceramic substrate, massive or obtained from fibres, by deposition in the vapour phase wherein a coating is deposited on the substrate by chemical means at a pressure lower than 10 kPa at a temperature lower than 600° C. and by using a system of precursors constituted of:

an organo-metallic precursor of the said metallic element selected from the organo-metallic compounds of the sandwich type of general formula:

$$[Ar^1MAr^2_n]L_xL'_y$$

in which $Ar^1$ and $Ar^2$, identical or different, represent a $C_5-C_8$ aromatic ring optionally substituted by 1 to 6 $C_1-C_4$ alkyl groups or a phenyl group, n represents 0 or 1, M represents a metallic element such as defined above, L and L' each represents a hydrogen atom or a halogen atom, a CO, $CF_3$, R, RCN, $PR_3$, SR and SeR group, R being a $C_1-C_4$ alkyl group or phenyl group optionally substituted by 1 or 2 $C_1-C_4$ alkyl groups, pyridine, tetrahydrofuran, acetylacetonate, tetracyanoquinodimethane or L and L' represent together with M a ring $MS_4$ or $MS_5$ and x+y represent 0 to 4, and a nitrogen precursor selected from ammonia and hydrazine.

2. Process according to claim 1, wherein the organo-metallic precursor is selected from the compounds of the sandwich type in which the central metallic element is linked to two $C_5-C_8$ aromatic rings, optionally substituted by one to six $C_1-C_4$ alkyl groups.

3. Process according to claim 1, wherein the temperature of the substrate during the deposition is included between 300° and 600° C.

4. Process according to claim 2, wherein the metallic element is chromium and the organo-metallic precursor is selected from dibenzene chromium, the bis (arene) chromiums substituted by one to six $C_1-C_4$ alkyl groups and bis (cyclopentadienyl) chromium.

5. Process according to claim 4, wherein the nitrogen precursor is hydrazine and the organo-metallic precursor is dibenzene chromium.

6. Process according to claim 1, wherein a reducing gas or a source of carbon selected from the hydrocarbons is introduced into the vapour phase.

* * * * *